(12) United States Patent
Grivna (10) Patent No.: US 7,336,666 B1
(45) Date of Patent: Feb. 26, 2008

(54) DATA TRANSPORT FOR BIT-INTERLEAVED STREAMS SUPPORTING LANE IDENTIFICATION WITH INVALID STREAMS

(75) Inventor: Edward L. Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 1194 days.

(21) Appl. No.: 10/254,705

(22) Filed: Sep. 25, 2002

(51) Int. Cl.
*H04L 12/28* (2006.01)
*H04Q 11/00* (2006.01)

(52) U.S. Cl. ............... 370/395.51; 370/506; 370/535; 370/395.21; 370/377

(58) Field of Classification Search ............. 370/506, 370/510, 535, 377, 395.21, 395.43, 395.51, 370/395.52, 395.53; 348/584, 591, 592
See application file for complete search history.

(56) References Cited

U.S. PATENT DOCUMENTS

| | | | |
|---|---|---|---|
| 5,007,050 A * | 4/1991 | Kasparian et al. ......... | 370/280 |
| 5,398,241 A * | 3/1995 | Witchey .................... | 370/391 |
| 5,594,734 A * | 1/1997 | Worsley et al. ......... | 370/395.53 |
| 6,026,088 A * | 2/2000 | Rostoker et al. ....... | 370/395.53 |
| 7,100,020 B1 * | 8/2006 | Brightman et al. ........... | 712/18 |
| 2003/0035445 A1 * | 2/2003 | Choi ......................... | 370/535 |

OTHER PUBLICATIONS

"MAXIX +3.3V, 2.5Gbps, SDH/Sonet, 4-Channel Interconnect Mux/Demux ICs with Clock Generator", MAX3831/MAX3832, 19-1534; Rev. 1; Oct. 1999, 16 pages.

"Disabling the Channel-Assignment Feature of the MAX3831", Application Note: HFDN-1.0. Rev. 0, May, 2000, 5 pages.

* cited by examiner

*Primary Examiner*—Wing Chan
*Assistant Examiner*—Venkatesh Haliyur (57) ABSTRACT

A method for generating a channel stream. The method generally comprises the steps of (A) transforming a plurality of data streams, wherein every data stream entering the channel stream experiences a unique transformation and (B) serializing the data streams as transformed into the channel stream.

21 Claims, 6 Drawing Sheets

DATA TRANSPORT FOR BIT-INTERLEAVED STREAMS SUPPORTING LANE IDENTIFICATION WITH INVALID STREAMS

FIELD OF THE INVENTION

The present invention relates to a method and/or architecture for data stream multiplexing and demultiplexing generally and, more particularly, to data transport for bit-interleaved streams supporting lane identification with invalid streams.

BACKGROUND OF THE INVENTION

The telecommunications industry uses serial data transmission to move large amounts of data from one point to another. Both conventional Plesiochronous Digital Hierarchy (PDH) (i.e., T1/E1, T3/E3, etc.) and conventional Synchronous Optical Network/Synchronous Digital Hierarchy (SONET/SDH) systems multiplex or aggregate multiple source streams together to allow a single serial stream to carry multiple lower speed sources. The conventional systems multiplex the source streams based upon character boundaries that force additional latency into the system to allow the channels to be interleaved.

Recent backplane designs for transporting the source data streams are using bit interleaving to reduce the latency, and lower the hardware overhead needed to handle the multiplexing and demultiplexing functions. Each source data stream is accepted as a serial stream, and the bits of each source data stream are sequentially bit-wise interleaved or aggregated to generate a single faster bit stream. Multiplexing 'n' source data streams together produces a serial data stream that is n-times faster than each of the source data streams.

Where the aggregation function is desired but a logic overhead and delay of full framers are not available or wanted, the aggregation function can still occur by doing a bit-level or byte-level multiplexing of the individual source data streams. Since there are generally no distinguishing characteristics within the data itself to identify which source data stream is which, and the fact that more than one of the source data streams can theoretically be carrying the same data, there needs to be some way to distinguish each of the source data streams for separation at the receiver. Furthermore, there needs to be some way to resolve the received source data stream into particular lanes. When the single higher-speed serial data stream arrives at the destination, the 'n' source data streams need to be separated. Standard clock recovery, data recovery, and demultiplex functions can provide the separation, but the extracted (de-interleaved) serial data streams have no default orientation as to which source data stream should come out on a specific output bit-stream or lane.

Figure 1:
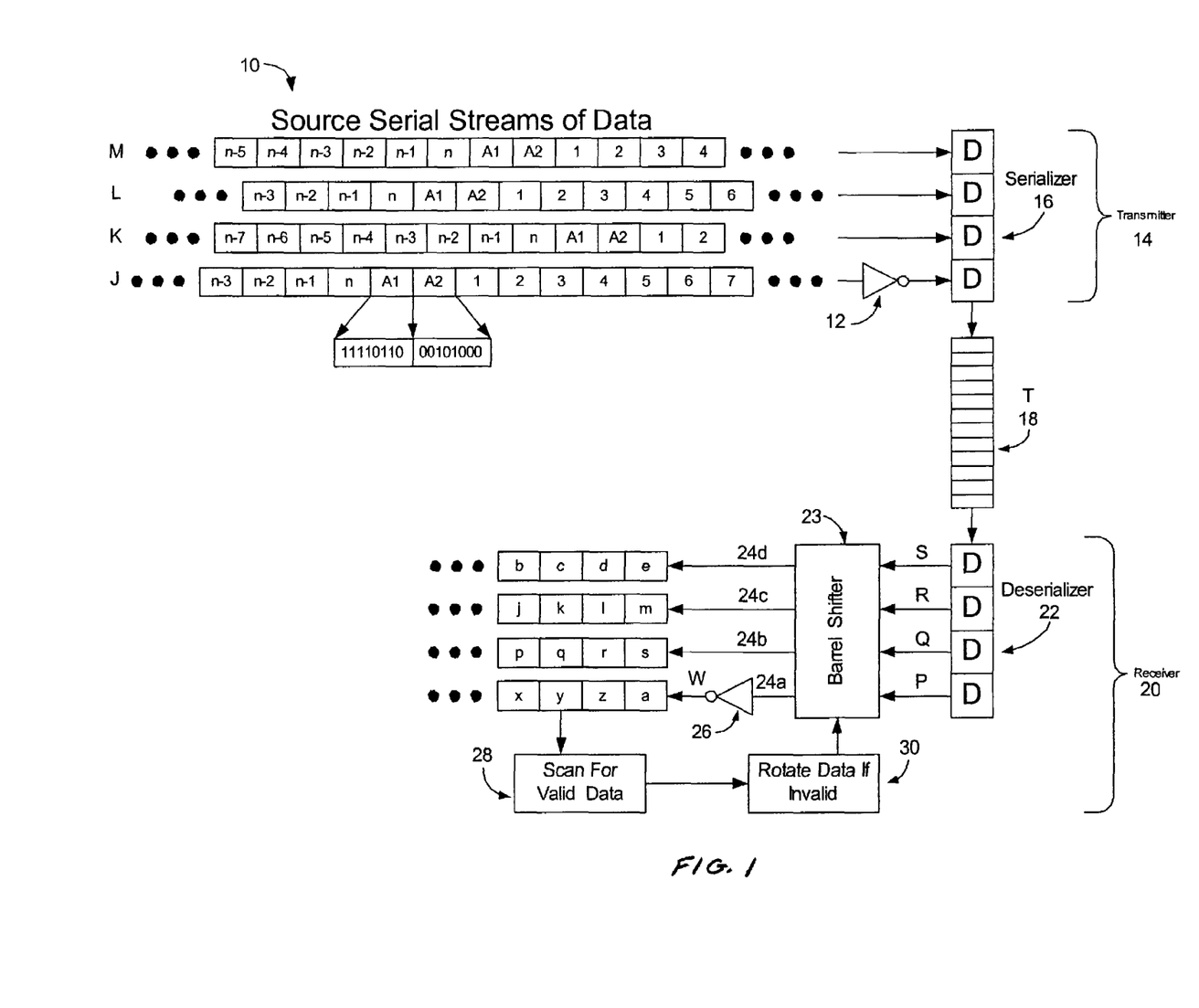
FIG. 1 is a block diagram of a conventional data stream interleaving system.

Referring to FIG. 1, a block diagram of a conventional data stream interleaving and de-interleaving system 10 is shown. The system 10 inverts 12 a master source data stream (i.e., J) among several source data streams (i.e., J–M) in a transmitter 14 prior to a serializer 16. The serializer 16 interleaves the source data streams J–M into a channel stream (i.e., T) that is transmitted through a channel 18. The inversion 12 is effectively a lossless and reversible form of data manipulation that allows the master source data stream J to be identified from the other source data streams K–M at a receiver 20.

At the receiver 20, the channel stream T is separated into multiple destination streams (i.e., P–S) using a deserializer 22. The destination streams P–S are passed to a barrel shifter 23 to allow each of the possible destination streams P–S to be allocated to one of several lanes 24a–d. The particular destination stream P–S routed through the lane 24a is then inverted 26 to produce an inverted stream (e.g., W). The inverted stream W is tested for characteristics of the master source data stream J. Testing involves scanning 28 the inverted stream W for a specific frame construct that may be present. If the frame construct is not found, the barrel shifter 23 is ordered to rotate 30 to route a next destination stream P–S through the inverter 26. Scanning 28 and rotation 30 are continued until the specific frame construct is found in the inverted stream W. In practice, the non-inverted source data streams K–N should not generate a match condition when inverted 26. However, the inverted master source data stream J (after the secondary inversion 26) will allow proper detection of the frame construct.

The system 10 works while the four source data streams J–M are always present. However, SONET/SDH equipment does not provide for each source data stream J–M to originate from the same card, nor to be active all at the same time. Therefore, it is possible for one or more of the source data streams J–M to be missing or void of valid information. If a channel generating the master source data stream J ever goes away, the receiver 20 has no way of identifying the proper destination of the resulting destination data streams P–S. Therefore, allocating the destination streams P–S among the proper lanes 24a–d becomes impractical.

SUMMARY OF THE INVENTION

The present invention concerns a method for generating a channel stream. The method generally comprises the steps of (A) transforming a plurality of data streams, wherein every data stream entering the channel stream experiences a unique transformation and (B) serializing the data streams as transformed into the channel stream.

The objects, features and advantages of the present invention include providing a method and/or architecture for data transport of bit-interleaved streams supporting lane identification that may (i) operate with non-standard or invalid source channels, (ii) uniquely identify data streams containing similar or the same data at a receive end, (iii) detect when some and/or all of the data streams may be invalid/non-standard, and/or (iv) add no overhead to the transmitted data.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
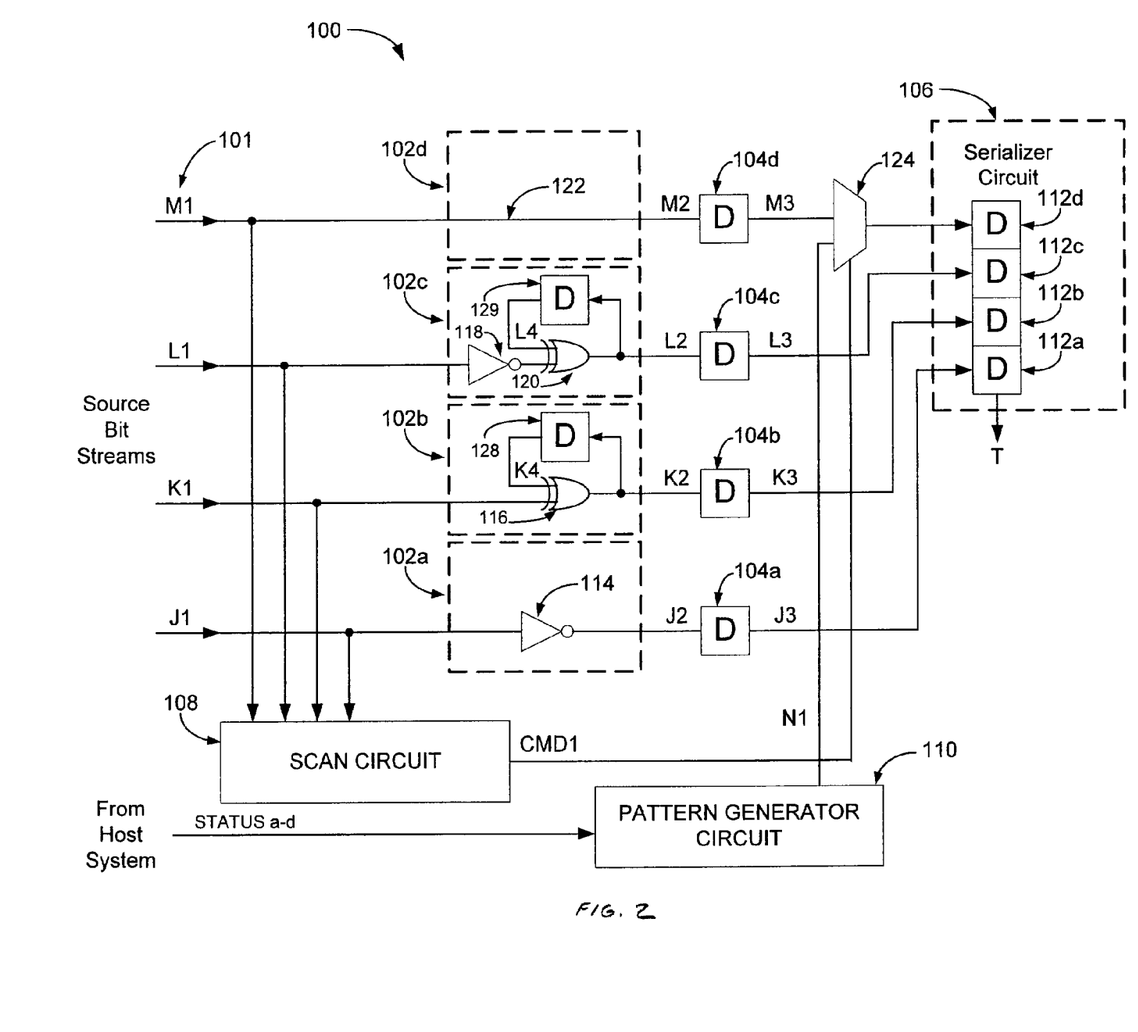
FIG. 2 is a block diagram of an example implementation of a transmitter circuit incorporating a preferred embodiment of the present invention.

Referring to FIG. 2, a block diagram of an example implementation of a circuit 100 is shown incorporating a preferred embodiment of the present invention. The circuit 100 may be implemented as a transmitter circuit. The transmitter circuit 100 may be configured to interleave multiple signals or source data streams (e.g., J1–M1) received at an input 101 into a single signal or stream (e.g., T). The stream T may be referred to as a high-speed stream, a transmission stream, a transport stream, and/or a channel stream. Each source data stream J1–M1 may be simultaneously transformed by a unique transformation, synchronized if appropriate, and then serialized to generate the channel stream T. The transformations may be reversible (e.g., lossless) to permit recovery of the original source data streams J1–M1 at a receiving end.

The transmitter circuit 100 generally comprises multiple circuits 102a–d, multiple register circuits 104a–d, and a serializer circuit 106. The transmitter circuit 100 may optionally comprise a scan circuit 108 and a pattern generator circuit 110. The transmitter circuit 100 may be designed to receive more or less than four source data streams J1–M1 to meet the design criteria of a particular application. Furthermore, the transmitter circuit 100 may be configured to multiplex the source data streams J1–M1 into multiple channel streams T to meet the design criteria of a particular application. The four-to-one multiplexing shown may be considered as an example for illustrative purposes.

The circuits 102a–d may be configured as transformation circuits. Each transformation circuit 102a–d may perform a modification to a respective source data stream J1–M1 to generate transformed data streams (e.g., J2–M2). The modifications performed by each transformation circuit 102a–d may be unique among the other modifications or transformations. In one embodiment, the modifications may be designed as zero-overhead modifications, meaning that a same amount of data may be generated by the transformation circuits 102a–d as received by the transformation circuits 102a–d. In another embodiment, the modifications may introduce some overhead to the transformed data streams J2–M2.

Each register circuit 104a–d may be configured as a single flip-flop in the form of a pipeline register present in each data stream. The register circuits 104a–d may be optionally implemented to keep latencies matched for (e.g., synchronize) all four transformed data streams J2–M2 where appropriate. Each register circuit 104a–d may be configured to store a unit of a respective transformed data stream J2–M2. The unit may be defined as a bit, a nibble, a byte, a 9-bit word, a 10-bit word, a 16-bit word, a 32-bit word, a 64-bit word, a frame, or similarly bounded amount of data. More or fewer registers may be added to each stream without effect on the data content or operation of the circuit, with the only impact being latency of data transferred though the circuit 100. In one embodiment, the storing may be performed in a serial fashion storing a single bit at a time. In another embodiment, the storing may be performed in a sequential fashion where several bits may be stored at a time. Presentation of the stored data may be performed serially, in parallel, or sequentially. The register circuits 104a–d may present stored data streams (e.g., J3–M3) respectively to the serializer circuit 106.

The serializer circuit 106 may receive each of the stored data streams J3–M3 in register circuits 112a–d. The register circuits 112a–d may receive the stored data streams J3–M3 in the same fashion (serial or parallel) as presented by the register circuits 104a–d. The register circuits 112a–d may be interconnected to generate the channel stream T from the stored data streams J3–M3. In one embodiment, the channel stream T may be implemented as a single-bit wide serial data stream. In another embodiment, the channel stream T may be implemented as a multi-bit wide data stream, multiple signals, and/or one or more signals having multiple levels and/or phases.

The following transformation examples may be based on a single-bit wide source data streams J1–M1. The transformation circuit 102a may be configured to perform an inverting transformation. The transformation circuit 102a may comprise an inverter 114 configured to receive the source data stream J1 and generate the transformed data stream J2. The inverting transformation may be defined by equation 1 as follows:

$$G(X) = -1 \qquad \text{Eq. (1)}$$

The transformation circuit 102b may be configured to perform an NRZI encode operation. An XOR gate 116 may receive the source data stream K1 and a history data stream (e.g., K4) as inputs to generate the transformed data stream K2. The transformed data stream K2 may be captured in a register circuit 128 to generate the history data stream K4. Thus, the data stream K2 may be a non-return to zero invert-on-one (NRZI) modification of the source data stream K1. The NRZI transformation may be defined by equation 2 as follows:

$$G(X) = X + 1 \qquad \text{Eq. (2)}$$

The transformation circuit 102c may be configured to perform an inverted NRZI encode operation on the source data stream L1. Inversion of the source data stream L1 may be provided by an inverter 118. The inverter 118 may be connected in series with an XOR gate 120 that also receives a history data stream (e.g., L4). The XOR gate 120 may generate the transformed data stream L2. The transformed data stream L2 may be captured in a register circuit 129 to generate the history data stream L4. Therefore, the data stream L2 may be an NRZI transformation of the inverted source data stream L1. The inverted NRZI transformation may be defined by equation 3 as follows:

$$G(X) = X - 1 \qquad \text{Eq. (3)}$$

The transformation circuit 102d may be configured to perform a unity transformation on the source data stream M1. The unity transformation may be implemented as a non-inverting amplifier (not shown) or a conductor 122 (shown) conveying the source data stream M1 to the register circuit 104d. Therefore, the transformed data stream M2 may be identical to the source data stream M1. The unity transformation may be defined by equation 4 as follows:

$$G(X) = 1 \qquad \text{Eq. (4)}$$

Figure 3:
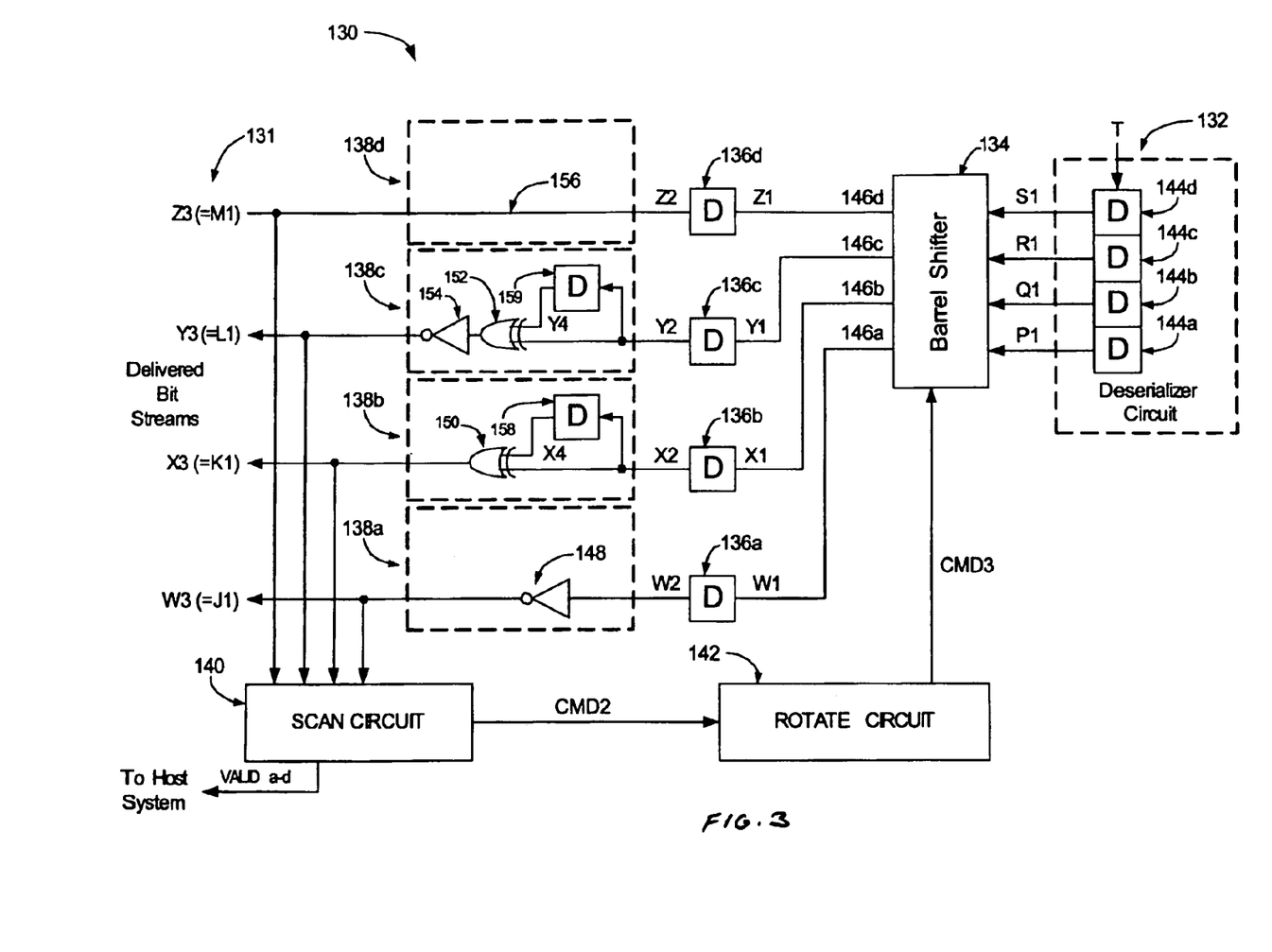
FIG. 3 is a block diagram of an example implementation of a receiver circuit.

In general, there may be 'n' transformation circuits 102a–d, one for each of the 'n' source data streams J1–M1. In one embodiment, n−1 of the transformations may be implemented with active logic circuitry while a single transformation (e.g., in the transformation circuit 102d) may be implemented with passive circuitry or may be absent. Each transformation may be unique from the other transformations. Furthermore, each transformation may be reversible through complementary logic at a receiver (FIG. 3). Each transformation circuit 102a–d may be implemented to provide a single step or a multi-step transformation. In the domain of logic, there may be effectively a large number of the logic transforms that may be applied to any given source data stream J1–M1. The transformations may include, but are not limited to, logic transformations, polynomial transformations, synchronous scrambler transformations, encryption transformations, and the like. The uniqueness and reversibility of the transformations generally allows every source data stream J1–M1 to be distinguished and identified at the receiver when at least one of the source data streams J1–M1 may be valid.

The pattern generator circuit 110 may be included in the transmitter circuit 100 for situations where all of the source data streams J1–M1 may be invalid, non-standard, and/or none of the source data streams J1–M1 may contain a predetermined reference pattern expected by the receiver. The pattern generator circuit 110 may be configured to generate a valid source data stream (e.g., N1) having the predetermined reference pattern either continuously or when appropriate. The source data stream N1 may be inserted into the serializer 106 in place of one of the stored data streams J3–M3. For example, a multiplexer 124 may be used to replace the (invalid or non-standard) stored data stream M3 with the source data stream N1. Control of the multiplexer 124 may be provided from the pattern generator circuit 110, the scan circuit 108, or a host (not shown). In another embodiment, the source data stream N1 may be inserted in place of one of the source data streams J1–M1 before the transformation circuits 102a–d.

The pattern generator circuit 110 may be directed by the host. Control by the host may be provided through a set of signals (e.g., STATUSa–d). The host may mark each signal STATUSa–d with a valid or invalid/non-standard condition of a respective source data stream J1–M1. If all of the source data streams J1–M1 are marked invalid/non-standard by the host, the pattern generator circuit 110 may generate and present the valid source data stream N1.

Control of the multiplexer 124 may be provided from the scan circuit 108 through a signal (e.g., CMD1). The scan circuit 108 may monitor the source data streams J1–M1 for the predetermined reference pattern. If the predetermined reference pattern is found in at least one source data stream J1–M1, the scan circuit 108 may generate the signal CMD1 in a valid state. The valid state of the signal CMD1 may instruct the multiplexer 124 to route the source data stream M3 to the serializer circuit 106. If the predetermined reference pattern is not found in any of the source data streams J1–M1, the scan circuit 108 may generate the signal CMD1 in an invalid state. The invalid state of the signal CMD1 may instruct the multiplexer 124 to route the source data stream N1 in place of the stored data stream M3 (as shown), one of the source data streams J1–M1, or one of the other stored data streams J3–L3.

The predetermined reference pattern or other validation signature may be specific to each particular application. For example, in a Synchronized Optical Network/Synchronous Digital Hierarchy (SONET/SDH) application and/or an Optical Transport Network (OTN), a frame construct may be used as the predetermined reference pattern. In one embodiment, the predetermined reference pattern may comprise a sequence of consecutive A1 characters followed by consecutive A2 characters. In another embodiment, the predetermined reference pattern may comprise three consecutive A1 characters followed by three consecutive A2 characters. Other reference patterns may be implemented to meet the design criteria of a particular application.

The scan circuit 108 generally scans each of the source data streams J1–M1 continuously. Per SONET/SDH, the A1/A2 characters may be repeated every 125 microseconds ($\mu$s). Therefore, the scan circuit 108 may wait for 125 $\mu$s, or slightly longer (e.g., $\geq$1 bit after 125 $\mu$s) before determining that the framing pattern construct may be missing from a source data stream J1–M1. Other scan periods may be implemented to determine if and when the predetermined reference pattern becomes absent.

Referring to FIG. 3, a block diagram of an example implementation of a circuit 130 is shown. The circuit 130 may be implemented as a receiver circuit. The receiver circuit 130 may be configured to de-interleave and deserialize the channel stream T into multiple received data streams (e.g., P1–S1). Each received data stream P1–S1 may be routed to a unique transformation to undo the transformations of the transformation circuits 102a–d in the transmitter circuit 100. While the received data streams P1–S1 may be routed to the correct reverse transformations, the original source data streams J1–M1 may be reproduced at an output 131 of the receiver circuit 130.

The receiver circuit 130 generally comprises a deserializer circuit 132, a circuit 134, multiple register circuits 136a–d, multiple circuits 138a–d, a scan circuit 140, and a rotate circuit 142. The circuit 134 may be implemented as a multiplexer circuit or a barrel shifter circuit. Each register circuit 136a–d may be configured as n (where n is an integer) flip-flops in the form of pipeline registers present in each data stream. Each circuit 138a–d may be implemented as a transformation circuit.

The deserializer circuit 132 may be configured to convert the channel stream T into the received data streams P1–S1. The deserializer circuit 132 generally comprises multiple register circuits 144a–d. Each register circuit 144a–d may be coupled together to receive the channel stream T in a serial fashion. Reception may match the width of the channel stream T. For example, a single-bit wide channel stream T may be received by the register circuit 144d one bit at a time. A multi-bit wide channel stream T may be received several bits at a time. As each new bit or bits are received, the older bits may be shifted serially down through the register circuits 144a–d. When all of the register circuits 144a–d are generally full, the contents of the register circuits 144a–d may be presented to the barrel shifter circuit 134 as portions of the received data streams P1–S1. Each received data stream P1–S1 may be implemented as a single-bit wide or multiple-bit wide signal.

The barrel shifter circuit 134 may be operational to route each of the received data streams P1–S1 to one of several lanes 146a–d of the receiver circuit 130. The received data streams P1–S1 may be referred to as shifted data streams W1–Z1 while residing in the lanes 146a–d. An allocation of the received data streams P1–S1 to the shifted data streams W1–Z1 may be determined by the shifting or multiplexing functionality provided by the barrel shifter circuit 134. For example, if the received data stream P1 is routed to the shifted data stream Y1 in the lane 146c, the other received data streams Q1, R1, and S1 may be routed to the shifted data streams Z1, W1, and X1 respectively.

The register circuits 136a–d may keep latencies matched for all four shifted data streams W1–Z1. Each register circuit 136a–d may be configured to store a unit or portion of the respective shifted date stream W1–Z1. The unit may be defined to be the same as in the transmitter circuit 100. In one embodiment, storing may be performed in a serial fashion storing a single bit at a time. In another embodiment, storing may be performed sequentially where several bits are stored at a time. Presentation of the stored data may be performed serially, in parallel, or sequentially. The register circuits 136a–d may present stored data streams (e.g., W2–Z2) respectively to the transformation circuits 138a–d.

Each transformation circuit 138a–d may be designed to perform a transformation unique among the other transformations. Generally, each of the transformation circuits 138a–d in the receiver 130 may implement a reverse transformation of a complimentary transformation circuit 102a–d in the transmitter circuit 100. Furthermore, the assignment of the transformation circuits 138a–d to the lanes 146a–d may match the assignment of the transformation circuits 102a–d to the inputs of the serializer circuit 106.

The transformation circuit 138a may be configured to perform an inverting transformation. The transformation circuit 138a may comprise an inverter 148. The inverter 148 may be configured to receive the stored data stream W2 and generate a transformed data stream W3.

The transformation circuit 138b may be configured to perform an NRZI decode operation. An XOR logic gate 150 may receive the stored data stream X2 and a history data stream (e.g., X4) as inputs to generate a transformed data stream X3. The stored data stream X2 may be captured in a register circuit 158 to generate the history data stream X4. Therefore, the stored data stream X3 may be an NRZI decode transformation of the shifted data stream X1.

The transformation circuit 138c may be configured to perform an inverted NRZI decode operation. An XNOR operation may be provided by an XOR logic gate 152 in series with an inverter 154. The XOR logic gate 152 may receive the stored data stream Y2 and a history data stream (e.g., Y4) as inputs. The inverter 154 may invert the output signal generated by the XOR logic gate 152. The stored data stream Y2 may be captured in a register circuit 159 to generate the history data stream Y4. Therefore, a transformed data stream Y3 may be an inverted NRZI transformation of the shifted data stream Y1.

The transformation circuit 138d may be configured to perform a unity transformation on the stored data stream Z2. The unity transformation may be implemented as a non-inverting amplifier (not shown) or a conductor 156 (shown) conveying the stored data stream Z2. Therefore, a transformed data stream Z3 may be identical to the stored data stream Z2.

Similar to the transmitter circuit 100, the receiver circuit 130 may have 'n' transformation circuits 136a–d, one for each of the 'n' shifted data streams W1–Z1. In one embodiment, n–1 of the transformations may be implemented with active logic circuitry while a single transformation (e.g., provided by the transformation circuit 138d) may be implemented with passive circuitry or may be absent. Each transformation may be unique among the other transformations. Each transformation may also be a reverse of the respective transformation logic in the transmitter circuit 100. Each transformation circuit 138a–d may be implemented to provide a single step or a multi-step transformation. In the domain of logic, there may be effectively a large number of the logic transforms that may be applied to any given shifted data stream W1–Z1. The transformations may include, but are not limited to logic transformations, polynomial transformations, synchronous de-scrambler transformations, decryption transformations, and the like. The uniqueness and reversibility of the transformations generally allows every shifted data stream W1–Z1 to be distinguished at the receiver circuit 130 while at least one of the shifted data streams W1–Z1 may be valid.

The scan circuit 140 may receive one or more of the transformed date streams W3–Z3. The scan circuit 140 may generate a signal (e.g., CMD2). The scan circuit 140 may also generate multiple status signals (e.g., VALIDa–d), one for each lane 146a–d.

The scan circuit 140 may search each received transformed data stream W3–Z3 for the predetermined reference pattern. In the embodiment where the predetermined reference pattern may be the frame construct of a SONET/SDH data stream, the scan circuit 140 may scan each transformed data stream W3–Z3 for at least slightly longer (e.g., $\geq 1$ bit) than the 125 µs frame rate. If a valid predetermined reference pattern may be absent in all of the scanned transformed data streams W3–Z3 after a set period or number of bits have been scanned, the scan circuit 140 may generate the signal CMD2 in the invalid state. The invalid state of the signal CMD2 may instruct the rotate circuit 142 to command a rotation of the barrel shifter circuit 134. The rotate circuit 142 may generate a signal (e.g., CMD3) to instruct the barrel shifter circuit 134 to reroute or shift the received data streams P1–S1 by one or more lanes 146a–d. For example, the received data stream P1 may be rerouted from the lane 146b to the lane 146c. Thereafter, the shifted data stream Y1 may match the received data stream P1. Scanning and rotating may be continued until the predetermined reference pattern is generally detected in at least one of the transformed data streams W3–Z3. When the scan circuit 140 detects the predetermined reference pattern in at least one of the transformed data streams W3–Z3, the scan circuit 140 may generate the signal CMD2 in the valid state. The signal CMD2 in the valid state may instruct the rotate circuit 142 to hold the signal CMD3 at a current value.

An advantage of the present invention as compared to the conventional system 10 may be that the receiver circuit 130 may not rely on a presence of a valid single master source data stream. If any one or more of the transformed data streams W3–Z3 contains the reference pattern, the receiver circuit 130 may identify the correct alignment of the received data streams J1–S1 to the lanes 146a–d. Therefore, the transmitter circuit 100 and receiver circuit 130 may remain synchronized with each other while one or several of the source data streams J1–M1 may be absent, invalid, non-standard, and/or lack the reference pattern.

For each lane 146a–d monitored, the scan circuit 140 may generate a respective signal VALIDa–d. The scan circuit 140 may generate the respective signal VALIDa–d in the invalid state where the scan circuit 140 fails to find the predetermined reference pattern in the associated transformed data stream W3–Z3. The scan circuit 140 may generate the respective signal VALIDa–d in the valid state where the predetermined reference pattern may be detected in the associated transformed data stream W3–Z3. The signals VALIDa–d may be used at the receiver end to indicate status of the received data streams P1–S1.

The barrel shifter circuit 134 may be useful in the receiver circuit 130 since the deserializer circuit 132 may have no knowledge of how the individual transformed data streams J3–M3 are interleaved into the channel stream T. By stepping through each possible allocation of the received data streams P1–S1 through the various transformation circuits 138a–d, a correct match or shifting between the received data streams P1–S1 and the shifted data streams W1–Z1 may be determined by the scan circuit 140.

While the barrel shifter circuit 134 does not provide the correct match, the various transformation circuits 138a–d generally may not properly reverse the transformations performed in the transmitter circuit 100. In contrast, while the barrel shifter circuit 134 provides the correct routing of the received data streams P1–S1 to the shifted data streams W1–Z1, the transformation circuits 138a–d may reverse the transformations performed on the source data streams J1–M1 in the transmitter circuit 100. Each transformed data stream W3–Z3 may then represent an accurate reproduction of a respective source data stream J1–M1. Therefore, for each source data stream J1–M1 incorporating the predetermined reference pattern generally results in the predetermined reference pattern appearing in the associated transformed data stream W3–Z3. The scan circuit 140 may detect the predetermined reference patterns and maintain the present condition of the barrel shifter circuit 134. As a result, even if only one transformed data stream W3–Z3 has the predetermined reference pattern, then all of the transformed data streams W3–Z3 may be allocated to the proper lanes 146a–d, and undergo the correct reverse transformation. Therefore, each transformed data stream W3–Z3 may be identifiable with the source data streams J1–M1 based upon the final lane allocation. The identification may be useful where two or more of the source data streams J1–M1 carry similar, nearly identical, or even identical information that may make distinguishing the data streams difficult.

Figure 4:
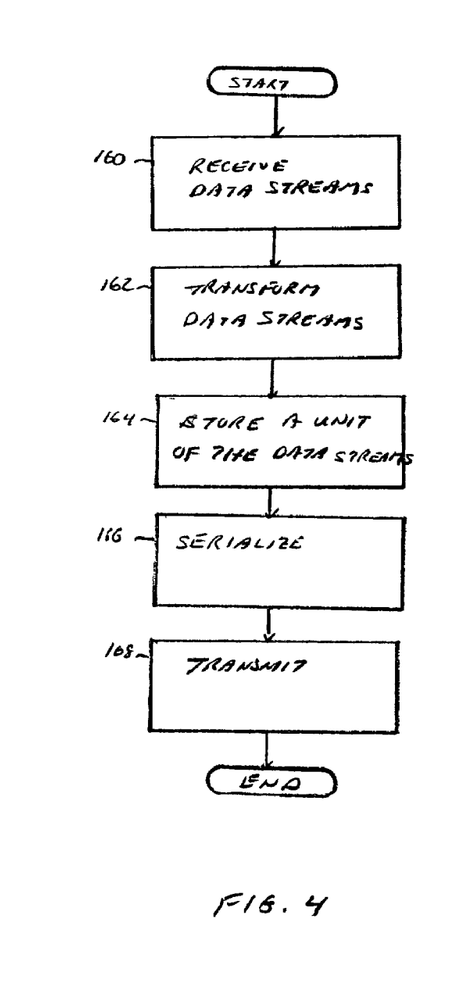
FIG. 4 is a flow diagram of a method for generating a channel stream.

Referring to FIG. 4, a flow diagram of a method for generating the channel stream T is shown. The method generally begins with reception of the one or more source data streams from the host (e.g., block 160). The transmitter circuit 100 then performs a unique transformation on each of the data streams (e.g., block 162). After experiencing the transformations, the data streams may be buffered or stored, if appropriate, to equalize the latency for all of the data streams (e.g., block 164). After storage, the data streams may be serialized to interleave the individual data streams to generate the channel stream T (e.g., block 166). Finally, the channel stream T may be transmitted to the receiver circuit 130 (e.g., block 168).

Figure 5:
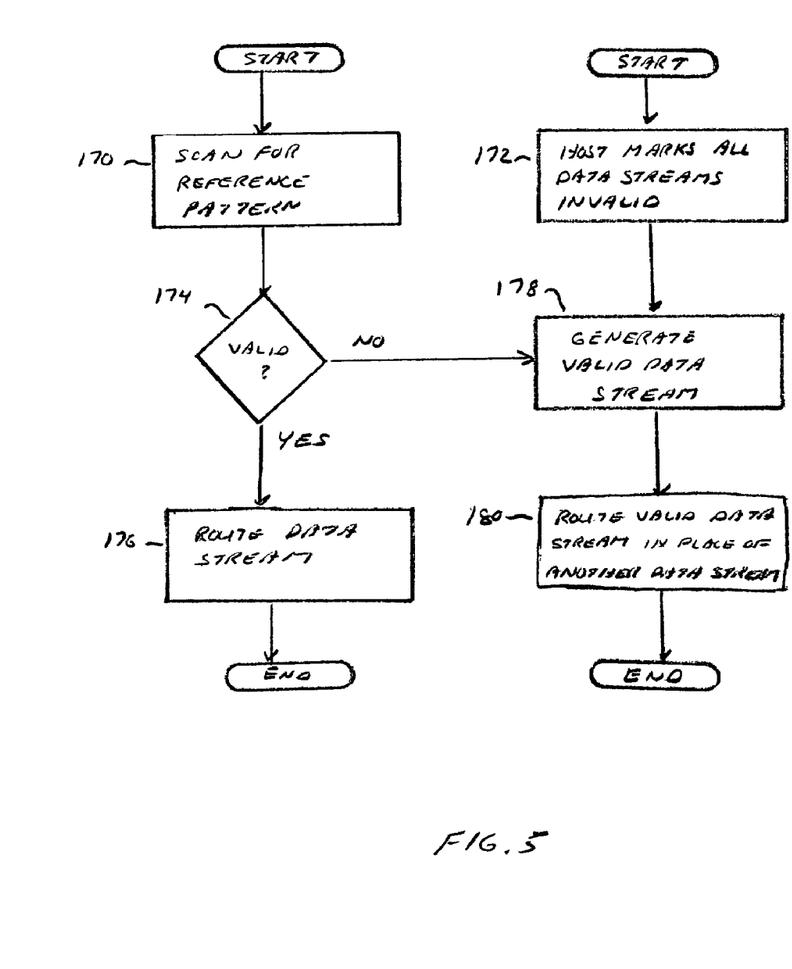
FIG. 5 is a flow diagram of a method for adding a valid data stream to a channel stream.

Referring to FIG. 5, a flow diagram of a method for adding a valid data stream to the channel stream T is shown. The method may begin either by scanning the source data streams for the reference pattern (e.g., block 170) or by the host marking all of the source data streams as invalid/non-standard (e.g., block 172). If scanning of the source data streams identifies at least one valid data stream (e.g., the YES branch of decision block 174), the multiplexer 124 may address or route the source data stream (e.g., block 176). Continuously, or while all of the data streams are generally invalid/non-standard (e.g., the NO branch of decision block 174), as determined by the scan circuit 108 and/or the host, the pattern generator circuit 110 may generate a valid data stream (e.g., block 178). The valid data stream may then be inserted in place of one or more of the data streams (e.g., block 180).

Figure 6:
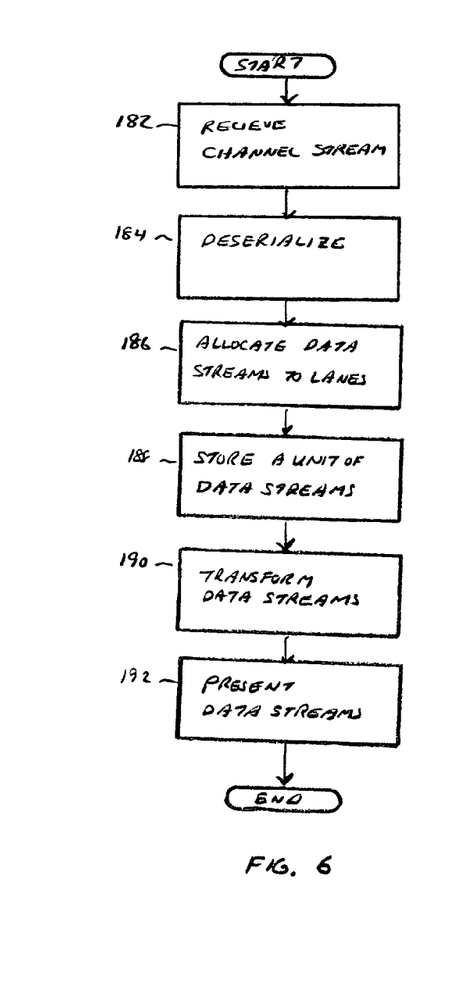
FIG. 6 is a flow diagram of a method for recovering data streams at a receiver circuit.

Referring to FIG. 6, a flow diagram of a method for recovering the data streams at the receiver circuit 130 is shown. The method may begin upon receipt of a portion of the channel stream T sufficient for the deserializer circuit 132 to operate (e.g., block 182). The deserializer circuit 132 may then deserialize and de-interleave the channel stream T into multiple data streams (e.g., block 184). The barrel shifter circuit 134 may route the individual data streams among the lanes (e.g., block 186). The data streams may then be stored or buffered in each lane (e.g., block 188). Unique reverse transformations may be applied to each data stream (e.g., block 190). Finally, the transformed data streams may be presented by the receiver circuit 130 to other circuitry (e.g., block 192).

Figure 7:
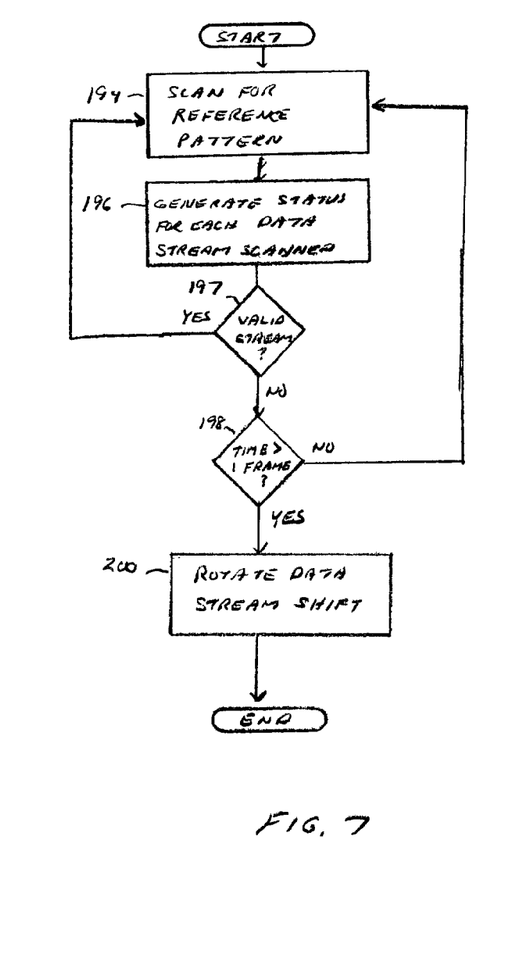
FIG. 7 is a flow diagram of a method for detecting a reference pattern in a receiver circuit.

Referring to FIG. 7, a flow diagram of a method for detecting the reference pattern in the receiver circuit 130 is shown. Detection may include scanning one, several, or all of the data streams after shifting, buffering, and transforming (e.g., block 194). A status signal may be generated for each lane to indicate if the data stream in the lane may be valid or not (e.g., block 196). If at least one valid reference pattern has been detected (e.g., the YES branch of decision block 197), shifting may be halted at a current position and scanning continued in case the reference pattern or patterns disappear. If no valid streams have been detected (e.g., the NO branch of decision block 197), a duration may be checked. If an entire frame has not been scanned (e.g., the NO branch of decision block 198), scanning may continue (e.g., block 194). If an entire frame has been scanned without detecting at least one reference pattern (e.g., the YES branch of decision block 198), the scan circuit 140 may instruct the rotate circuit 142 to command the barrel shifter circuit 134 to shift the data streams (e.g., block 200). Scanning and shifting may continue until all possible shift combinations between the received data signals and the lanes have been tested. If no valid data streams are detected, the barrel shifter circuit 134 may rotate back to an initial configuration and scanning may continue.

Figure 8:
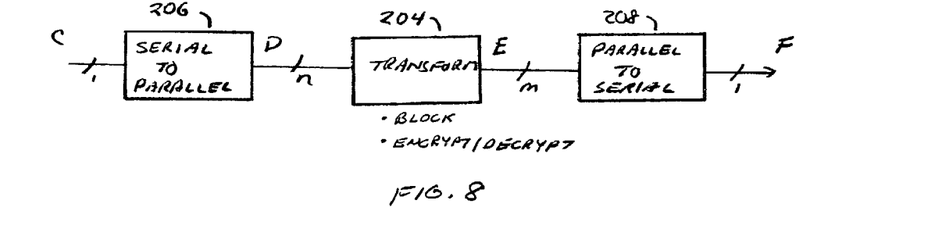
FIG. 8 is a block diagram of an example implementation of a multi-bit transformation circuit.

Referring to FIG. 8, a block diagram of an example implementation of a multi-bit transformation circuit 202 is shown. The transformation circuit 202 may be implemented in the transmitter circuit 100 and/or in the receiver circuit 130. The transformation circuit 202 generally comprises a circuit 204 in series between a serial-to-parallel converter circuit 206 and a parallel-to-serial converter circuit 208. By way of example, a single-bit wide signal or data stream (e.g., C) may be received by the serial-to-parallel converter circuit 206. The serial-to-parallel converter circuit 206 may store a unit comprising 'n' bits of the data stream C. The resulting n-bit wide data stream (e.g., D) may be transferred to the circuit 204. The circuit 204 may transform the n-bit data stream D into an m-bit signal (e.g., E). The transformation may be performed on the entire unit all at once. The resulting m-bit data stream E may be presented to the parallel-to-serial conversion circuit 208. The parallel-to-serial conversion circuit 208 may convert the data stream E back into a single-bit data stream (e.g., F).

A value of 'm' may be equal to or greater than a value of 'n' in the transmitter circuit 100. The value of 'm' may be less than or equal to the value of 'n' in the receiver circuit 130. The transformation may be a reversible block conversion using a lookup table and/or an appropriate mapping. A potential use of an n-bit to m-bit block conversion may be to change long sequences of all logical ones or all logical zeros into patterns having some logical ones and some logical zeros (e.g., reduce a DC component of a signal). Examples of reversible block conversions may be 8B/10B and 10B/8B block conversions. In another example, the block conversion may be implemented as an encryption in the transmitter circuit 100 and as a decryption in the receiver circuit 130. Other block conversions may be implemented to meet the design criteria of a particular application.

Figure 9:
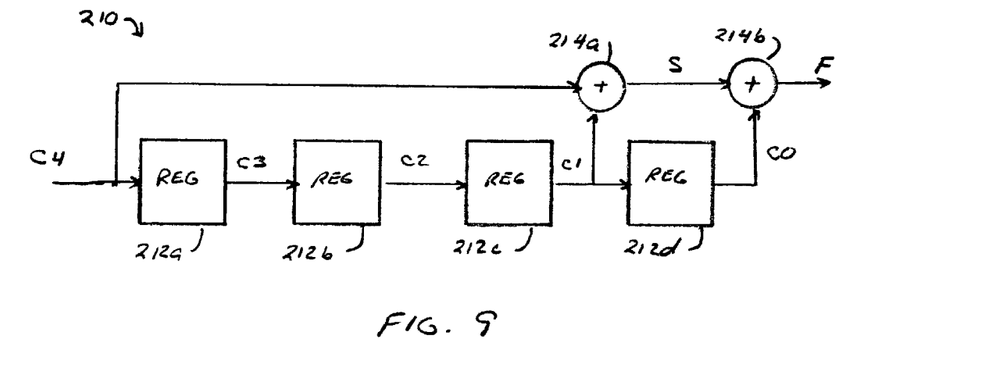
FIG. 9 is a block diagram of a second example implementation of a transformation circuit.

Referring to FIG. 9, a block diagram of a second example implementation of a transformation circuit 210 is shown. The transformation circuit 210 may be suitable for implementation in the transmitter circuit 100. The transformation circuit 210 generally comprises multiple registers 212a–d and multiple adders 214a–b.

The registers 212a–d may be configured as a serial shift register with the first register 212a receiving a signal (e.g., C4). A first modulo-two adder 214a may sum the signal C4 with an output signal (e.g., C1) from the third register 212c to generate a signal (e.g., S). A second modulo-two adder 214b may sum the output signal (e.g., C0) of the fourth register 212d and the signal S to generate a transformed signal (e.g., F). The transformation G(X) provided by the circuit 210 may define a polynomial as shown in equation 5 as follows:

$$G(X)=1+X+X^4 \qquad \text{Eq. (5)}$$

Figure 10:
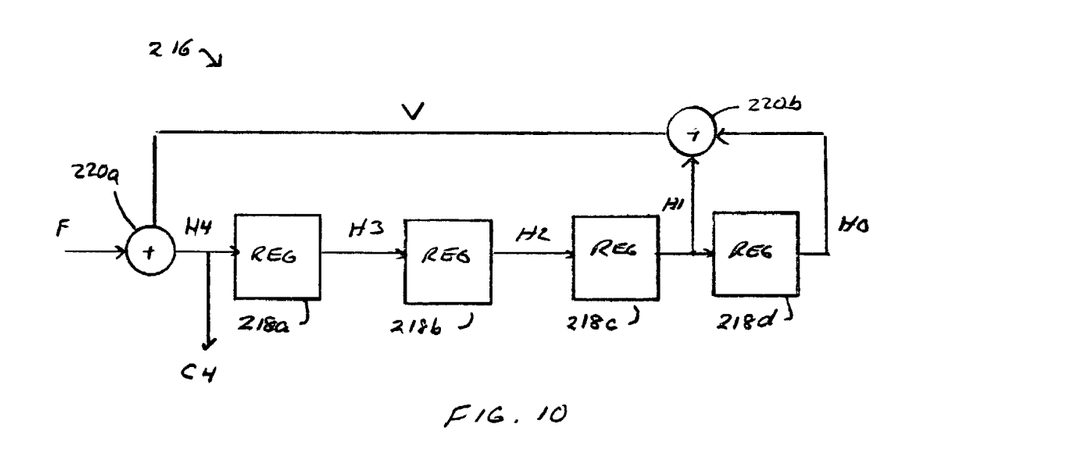
FIG. 10 is a block diagram of a third example implementation of a transformation circuit.

Referring to FIG. 10, a block diagram of a third example implementation of a transformation circuit 216 is shown. The transformation circuit 216 may be suitable for implementation in the receiver circuit 130. The transformation circuit 216 may provide a reverse transformation of the transformation circuit 210.

The transformation circuit 216 generally comprises multiple registers 218a–d and multiple adders 220a–b. The registers 218a–d may be configured to form a serial shift register. The first modulo-two adder 220a may sum the signal F (generated by the transformation circuit 210) with an output signal (e.g., V) from the second adder 220b. The second modulo-two adder 220b may sum an output signal (e.g., H1) generated by the third register 218c and an output signal (e.g., H0) generated by the fourth registers 218d to generate the output signal V. The sum generated by the first modulo-two adder 220a (e.g., H4) may be provided to the first register 218a and may also reproduce the original signal C4.

Referring to FIGS. 2 and 3, an example implementation of the transmitter circuit 100 may be to aggregate four OC12 bit streams that may be transported across an equivalent of an OC48 serial link. The channel stream T may be segregated back into four OC12 bit streams by the receiver circuit 130. By appropriate setting of the barrel shifter circuit 134, an allocation of the received OC12 bit streams may be directed to the proper lanes 146a–d. Therefore, each unique transformation performed in the transmitter circuit 100 may be completely reversed by the matching transformation in the receiver circuit 130.

More or fewer data streams may be multiplexed together by changing a size of the serialization/deserialization (SERDES) functions provided by the serializer circuit 106 and the deserializer circuit 132. Furthermore, the logic transform functions may be moved to any data stream in any order. For example, the unity transformation may be associated with the second source data stream K1 in the transmitter circuit 100 and the second shifted data stream X1 in the receiver circuit 130. In another embodiment, all of the data streams (instead of just n–1 data streams) may undergo non-unity transformations.

Interfaces to the serializer circuit 106 and the deserializer circuit 132 may be some multiple (other than 1) of a number of bit streams merged together. For example, the SERDES interfaces may be 8-bits wide and still accept and deliver four single-bit data streams. The multiple may also be configured as a non-integer by implementing gearbox logic to transform from a first width domain to a second width domain. Other designs may be implemented to meet the design criteria of a particular application.

The various signals of the present invention are generally "on" (e.g., a digital HIGH, valid, or 1) or "off" (e.g., a digital LOW, invalid, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for generating a channel stream, comprising the steps of:
   (A) transforming a plurality of data streams in parallel with a plurality of transformations, wherein a unique one of said transformations is provided for each respective one of said data streams; and
   (B) serializing said data streams as transformed into said channel stream.

2. The method according to claim 1, further comprising the step of synchronizing a plurality of units of data, one of said units from each respective one of said data streams, with each other prior to serializing.

3. The method according to claim 2, wherein at least one of said unique transformations receives a respective one of said units as an input.

4. The method according to claim 1, wherein at least one of said transformations comprises a plurality of sequential transformations.

5. The method according to claim 1, wherein at least one of said unique transformations comprises a block substitution transformation.

6. The method according to claim 1, wherein at least one or said unique transformations comprises a polynomial transformation.

7. The method according to claim 1, wherein at least one of said unique transformations comprises an encryption transformation.

8. The method according to claim 1, further comprising the step of detecting when all of said data streams are invalid.

9. The method according to claim 8, further comprising the steps of:
   generating a valid data stream; and
   replacing one of said data streams with said valid data stream.

10. The method according to claim 1, further comprising the steps of:
    deserializing said channel stream into a plurality of received data streams;
    routing each one of said received data stream into a respective one of a plurality of lanes; and
    transforming said received data streams in parallel with a plurality of inverse transformations, wherein a unique one of said inverse transformations is provided for each respective one of said lanes, to recover said data streams.

11. A method for demultiplexing a channel stream, comprising the steps of:
    (A) deserializing said channel stream into a plurality of data streams;

(B) routing each one of said data stream into a respective one of a plurality of lanes; and (C) transforming said data streams in parallel with a plurality of transformations, wherein a unique one of said transformations is provided for each respective one of said lanes.

12. The method according to claim 11, further comprising the step of scanning at least one of said data streams for a reference bit pattern.

13. The method according to claim 12, further comprising the step of rerouting said data streams among said lanes in response to an absence of said reference bit pattern.

14. The method according to claim 11, further comprising the step of scanning each of said data streams for a reference bit pattern.

15. The method according to claim 14, further comprising the step of asserting a respective valid signal for each one of said data streams in which said reference bit pattern is found.

16. The method according to claim 11, further comprising the step of storing a plurality of units of data in parallel, one unit from each respective one of said data streams, prior to transforming.

17. The method according to claim 16, wherein at least one of said transformations receives a respective one of said units as an input.

18. The method according to claim 11, wherein at least one of said transformations comprises a decryption transformation.

19. The method according to claim 11, wherein at least one of said transformations comprises a non-return to zero invert-on-one transformation.

20. A circuit comprising:

means for transforming a plurality of data streams in parallel with a plurality of transformations, wherein a unique one of said transformations is provided for each respective one of said data streams; and means for serializing said data streams as transformed into a channel stream.

21. A circuit comprising:

means for deserializing a channel stream into a plurality of data streams;

means for routing each one of said data stream into a respective one of a plurality of lanes; and means for transforming said data streams in parallel with a plurality of transformations, wherein a unique one of said transformations is provided for each respective one of said lanes.

* * * * *